July 3, 1962 R. W. ROCHELLE 3,042,810

FIVE TRANSISTOR BISTABLE COUNTER CIRCUIT

Filed Jan. 21, 1958 2 Sheets-Sheet 1

INVENTOR
ROBERT W. ROCHELLE

BY J. A. O'Connell
Richard C. Reed
ATTORNEYS

July 3, 1962 R. W. ROCHELLE 3,042,810

FIVE TRANSISTOR BISTABLE COUNTER CIRCUIT

Filed Jan. 21, 1958 2 Sheets-Sheet 2

INVENTOR
ROBERT W. ROCHELLE

BY J. A. O'Connell
Richard C. Reed
ATTORNEYS

United States Patent Office 3,042,810

Patented July 3, 1962

3,042,810

FIVE TRANSISTOR BISTABLE COUNTER CIRCUIT

Robert W. Rochelle, Bucknell Manor, Va., assignor to United States of America as represented by the Secretary of the Navy Filed Jan. 21, 1958, Ser. No. 710,377
2 Claims. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

This invention relates to electronic circuits and more particularly to binary counter circuits.

The binary counters of the prior art are usually very sensitive to load changes. If there is any unbalance in the load on the counter, the counter may not operate upon the application of a triggering pulse thereto. Also, loading will cause many binary counters previously available to misfire, that is, perform the binary function without the application of a trigger pulse. Further, the rate of change of output was unduely low. Also, in prior binary circuits, the magnitude of the output current was generally the same magnitude as the input current.

In the binary circuit of this invention, the binary counter switching circuit is isolated, or decoupled, from the load and the switching action of the switching circuit works directly on the swtching elements unaffected by the load. Also, any unbalance in the load on the counter has no effect on the switching of the switching elements and loading will not cause misfires. In the binary circuit of this invention, faster rates of change of outputs are possible because of the utilization of transsistors to force the load into the two opposed output states of the binary circuit. Further, a current gain is associated with the circuit of this invention since a very small current at the base of a transistor is sufficient to switch a current which is representative of the beta gain of such transistor. Also, a relatively small power input will supply relatively very large power loads in the outputs.

Therefore, it is an object of this invention to provide a binary circuit in which the operation thereof is unaffected by the load thereon.

Another object is to prevent misfires in the operation of a binary circuit.

Still another object is to provide a binary circuit the operation of which is at a much faster rate than was possible in prior binary circuits.

Another object is to provide a binary circuit in which an input of small current value will supply outputs of very large current values.

Other objects of this invention will become apparent upon a more comprehensive understanding of the invention for which reference is had to the following specification and drawings in which.

Figure 1:
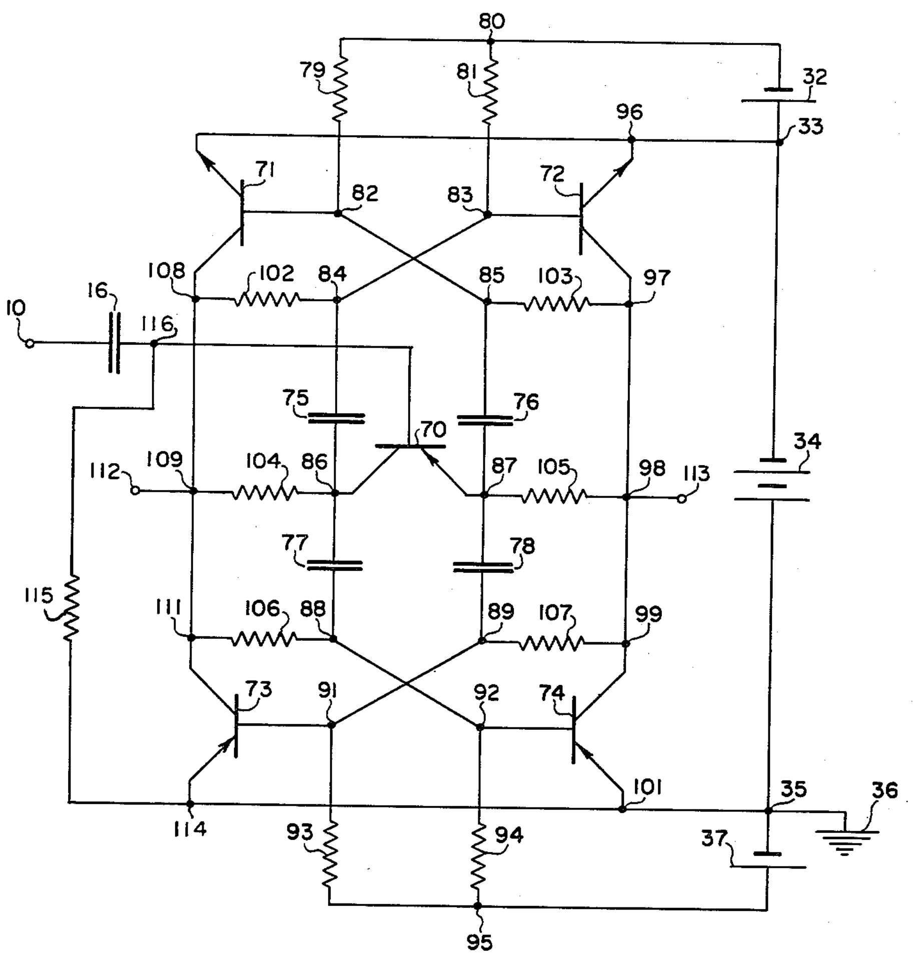
FIG. 1 is a schematic showing of an embodiment of the principles of this invention.

In the circuits of this invention, the property of a type of transistor to operate as any other general switching device for electrical current is utilized to provide a current flow which produces triggering pulses in the load switching control circuits, and not in the load circuits themselves. With the load switching elements being four transistors, two of which are PNP type and the other two are NPN type, the switching control circuit need supply only enough current to the bases of the four switching transistors to switch their conditions of conductivity. The circuit is symmetrical and when one condition of conductivity is obtained in the transistors, such condition is mantained until the receipt of a trigger circuit which will reverse the condition of conductivity of the transistors. With the collectors of one PNP transistor and one NPN transistor connected together with an output junction therebetween, the conductivity of one of such transistors determines the polarity of one terminal of the load. The two remaining switching transistors are connected in the same way and as such provide the opposite polarity to the other output terminal. In operation, one PNP transistor and NPN transistor diagonally disposed in the circuit array as shown in the drawings are simultaneously conductive.

In the binary circuit of FIG. 1, two switching NPN transistors 71 and 72 and two switching PNP transistors 73 and 74 are provided. To the power source 34 are connected, in series, bias power sources 32 and 37. The emitters of transistors 71 and 72 are connected through junctions 96 and 33 between the negative side of power source 34 and the positive side of power source 32. Bias resistors 79 and 81 are connected on one side to the negative side of power source 32 through junction 80, and on the other side to the bases of NPN transistors 71 and 72 through junctions 82 and 83 respectively. Also connected to junction 82 is the base of PNP transistor 73 through junction 85, resistor 103, junctions 97, 98 and 99, resistor 107 and junctions 89 and 91. The collector of transistor 72 is also connected to junction 97. The collector of transistor 71 is connected through junctions 108, 109, and 111, resistor 106, junctions 88 and 92 to the base of PNP transistor 74 and from junction 92 through resistor 94 and junction 95 to the positive side of power source 37. Also connected to junction 108 is the base of NPN transistor 72 through resistor 102 and junctions 84 and 83. Connected to junction 111 is the collector of transistor 73, the emitter of which is connected to the emitter of transistor 74 through junctions 114 and 101 and to the positive side of power source 34 through junction 35. It is noted that the potential at junction 35 is a reference potential as witnessed by its connection to ground 36. The base of transistor 73 is also connected to the power source 37 through junction 91, across resistor 93 and through junction 95. The triggering circuit includes input terminal 10 connected through capacitor 16 to the base of steering transistor 70. The emitter of transistor 70 is connected to junction 98 through junction 87 and across resistor 105, and the collector of which is connected to terminal 109 through junction 86 and across resistor 104. The base of PNP transistor 70 is connected to the positive side of power source 34 through junction 116, resistor 115 and junctions 114, 101 and 35. Capacitor 75 is connected between the base of transistor 72 and the collector of transistor 70 through junctions 86, 84 and 83. Capacitor 76 is connected between the emitter of transistor 70 and the base of transistor 71 through junctions 87, 85 and 82. Capacitor 77 is connected from the collector of transistor 70 to the base of transistor 74 through junctions 86, 88 and 92. Capacitor 78 is connected from the emitter of transistor 70 to the base of transistor 73 through junctions 87, 89 and 91, thereby completing the circuit. Outputs are taken at terminals 112 and 113 in the connections of the collectors of transistors 71 and 73 and of the collectors of transistors 72 and 74.

Figure 2:
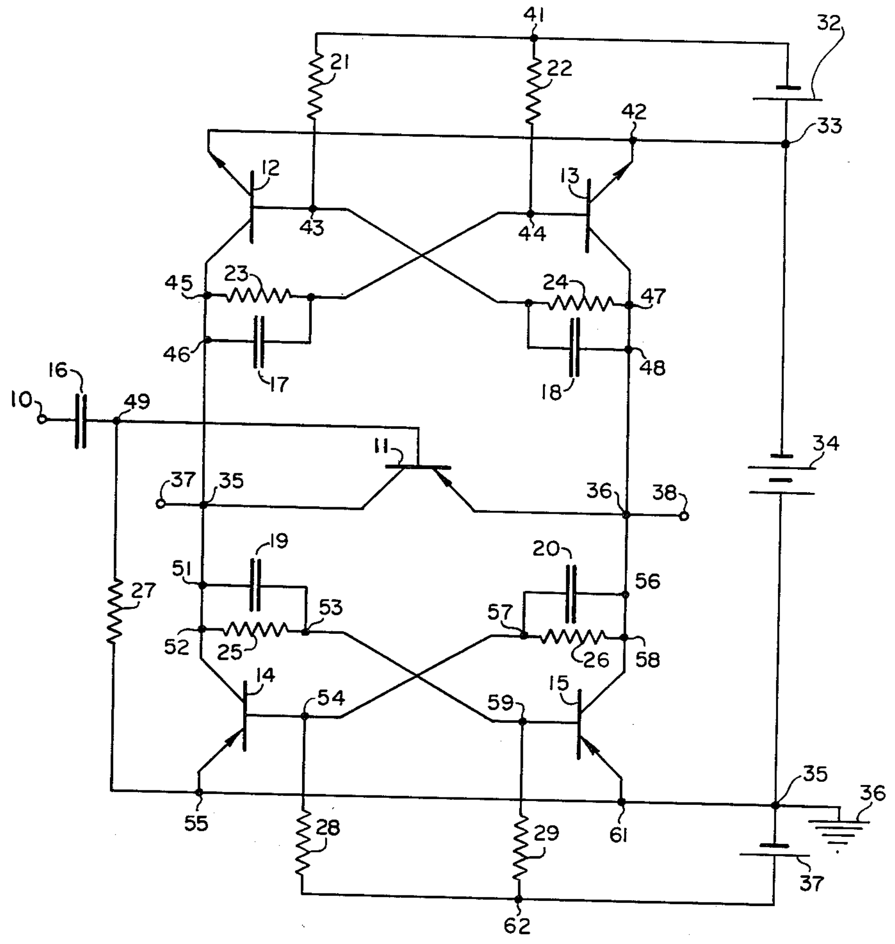
FIG. 2 is a schematic showing of a second embodiment of the principles of this invention.

In the binary circuit of FIG. 2, the circuit is identical with the circuit of FIG. 1 with the exception of a modification of the triggering circuit thereof. The emitter and collector of the steering transistor 11 are connected directly to the connections of the collectors of transistors 12 and 14 and of the collectors of transistors 13 and 15.

It is noted that steering transistors 70 and 11 are such that the inverted alpha is nearly equal to the normal alpha. Therefore, current flows practically equally well in either direction through the emitter and collector of each transistors 70 and 11, and transistors 70 and 11 can be connected with their emitters and collectors reversed from the connection shown in FIGS. 1 and 2 without altering the operation of the circuits.

The operation of the circuit of FIG. 1 is now presented. In the configuration of transistor switches as set forth in the circuit of this invention, one pair of diagonally disposed transistors is in conductive condition and the other diagonal pair is in nonconductive condition. This configuration of condition is maintained until an input pulse is applied to reverse the conductivity of the four switching transistors.

For example, first assume that transistors 71 and 74 are in conductive condition. The positive potential that is applied to the base of NPN transistor 71, through junctions 82, 85, 97, 99, 101 and 35 from power source 34 because transistor 74 is conductive, causes transistor 71 to be conductive. The same positive potential is also applied to the base of PNP transistor 73 through junctions 91, 89 and 99 rendering transistor 73 nonconductive. The drop of potential at junctions 108, 109, 111, 88, and 92, which results from the conductivity of transistor 71, is applied to the base of PNP transistor 74 maintaining it in conductive condition. This same negative potential is applied through junctions 84 and 83 to the base of NPN transistor 72 rendering it nonconductive. Therefore, when the transistor 74 is conductive, the current flow is from power source 34 through junction 35, transistor 74 and junctions 99, 98, 97, 85, 82, 80 and 33 back to power source 34 and when transistor 71 is conductive, the current flow is from power source 34 through junctions 35, 95, 92, 88, 111, 109, 108, transistor 71 and junctions 96 and 33 back to power source 34. This provides the proper polarities to maintain the transistors 71 and 74 in the operative conditions and the transistors 72 and 73 in the inoperative condition during which time the polarity of output terminal 112 is negative with respect to output terminal 113.

The receipt of a positive input pulse at terminal 10 and applied across capacitor 16 to the base of PNP transistor 70 will not cause transistor 70 to be conductive. As a result, a positive input pulse does not change the conductivity of the switching transistors nor the polarities at the output terminals 112 and 113.

The receipt of a negative input pulse at the base of steering transistor 70 causes transistor 70 to be conductive. Since the potential at junction 98 is positive with respect to junction 109, current will flow through transistor 70 in the normal alpha direction, that is, from emitter to collector. This causes the potential at junction 87 to fall and the potential at junction 86 to rise. The rise of potential at junction 86 is passed across capacitors 75 and 77 in the form of positive pulses which are applied to the base of NPN transistor 72 through junctions 84 and 83 and to the base of PNP transistor 74 through junction 88 and 92. Transistor 72 is switched from being nonconductive to being conductive while transistor 74 is switched from being conductive to being nonconductive. The fall of potential at junction 87 is passed across capacitors 76 and 78 in the form of negative pulses which are applied to the base of NPN transistor 71 through junctions 85 and 82 and PNP transistor 73 through junctions 89 and 91. Transistor 71 is switched from being conductive to being nonconductive while transistor 73 is switched from being nonconductive to be conductive. With the conductivity of all of the transistors being opposite to the conductivity which was altered by the said negative input pulse, the current paths are now from the positive side of power source 34 through junctions 35, 101, 114, transistor 73, junctions 111, 109, 108, 84, 83, 80 and 33 back to the negative side of power source 34 and from the positive side of power 34, through junctions 35, 95, 91, 89, 99, 98, 97, transistor 72, junctions 96 and 33 back to the negative side of the power source 34.

The output at terminal 112 is now positive with respect to output terminal 113. Upon the receipt of another negative input pulse which is applied to the base of transistor 70, current will flow in the reverse alpha direction through transistor 70. That is, the higher potential on the collector of transistor 70 caused the current to flow through the collector and then through the emitter. The fall of potential at junction 86 causes a negative pulse across capacitors 75 and 77 which is applied to the base of NPN transistor 72 and the base of PNP transistor 74. Transistor 72 switches to become nonconductive and transistor 74 switches to become conductive. The rise of potential at junction 87 causes a positive pulse across capacitors 76 and 78 which is applied to the base of NPN transistor 71 and to the base of PNP transistor 73. Transistor 71 switches to become conductive and transistor 73 switches to become nonconductive. The array of conductivity and the polarity of the output terminals is once more as it was before the receipt of the two negative input pulses. That is, the first negative input pulse reversed the polarities across the output terminals, and the second negative input pulse reset the polarities across the output terminals to their original polarities, which is the binary action desired in this circuit.

The several resistors 79, 81, 102, 103, 106, 107, 93 and 94 are provided to limit the current to the bases of the transistors and also to provide means for providing the proper voltage drops in the circuit that are needed to assure the proper operation of the circuit.

The operation of the circuit of FIG. 2 is identical with the operation of the circuit of FIG. 1. It is noted that in the circuit of FIG. 2, the current limiting resistors 104 and 105 of the circuit of FIG. 1 have been omitted and that the collector and the emitter of the steering transistor 11 are connected directly to the circuit lead which connects the collectors of transistors 12 and 14 and the lead which connects collectors of transistors 13 and 15. It follows that the circuit of FIG. 1 is operative even when junctions 109 and 86 are shorted across and when junctions 87 and 98 are shorted across, thereby providing a greater voltage drop across the steering transistor 11 than when the load isolating resistors are included.

So it is seen that I have provided an efficient binary stage which is insensitive to changes in the load on the circuit and in which misfires are virtually eliminated. In the complementary type circuitry of this invention, faster rates of change of output are possible because the transistors are forcing the load into the two opposed polarity states with the switching circuit decoupled therefrom. Also, in the circuit of FIG. 1, the decoupling resistors 104 and 105 allow the switching action to work directly on the bases of the transistors without the load across terminals 112 and 113 loading down the switching transistor 70. Also, a current gain is associated with the binary circuit of this invention since a current of one milliampere at the base of transistor 70 or 11 allows the switching of a current representative of the beta gain of either of the said transistors, with the very desirable result of a small power input controlling very large loads.

In a typical circuit, transistor 70 is type 2N128 as are also transistors 73 and 74. Transistors 71 and 72 are type 2N146. Resistors 79, 81, 93 and 94 have the value of 56 K. Resistors 102, 103, 106 and 107 have the value of 33 K. Resistors 104 and 105 have the value of 3.9 K. Resistor 115 has the value of 27 K. The capacitors 16, 75, 76, 77 and 78 have the capacitance of .001 mfd. The batteries in the power sources 32, 34 and 37 provide a potential of 1.3 volts.

Obviously many modifications and variations of the present invention are possible in the light of the above teachings. It is therefore to be understood that within the scope of the appended claims the invention may be practiced otherwise than as specifically described.

What is claimed is:

1. In a binary counter circuit an input terminal, a D.C. power source, first and second output terminals, first and second pnp load transistors, first and second npn load transistors, each of said transistors having a base, an emitter and a collector, the positive terminal of said power source being connected to the emitters of said first and second pnp load transistors, the negative terminal of said power source being connected to the emitters of said first and second npn transistors, the collectors of said first pnp and said first npn transistors being connected to said first output terminal, the collectors of said second pnp and said second npn transistors being connected to said second output terminal, a first D.C. biasing source having a negative terminal connected to he positive terminal of said power source, a second D.C. biasing source having a positive terminal connected to the negative terminal of said source, a first biasing network interconnecting the bases of said first pnp and said first npn load transistors and said second output terminal, a second biasing network interconnecting the bases of said second pnp and said second npn load transistors and said first output terminal, means connecting said first and second biasing networks in parallel between the positive terminal of said first biasing source and the negative terminal of said second biasing source and input means for reversing the conductive states of said pnp and npn load transistors including a steering transistor with normal and inverted alpha characteristics that are equal, said steering transistor having a base terminal, an emitter terminal and a collector terminal, a first input coupling means connecting said base terminal of said steering transistor to said input terminal of said binary counter circuit, a second input coupling means connecting said emitter terminal of said steering transistor to said first output terminal of said binary counter circuit, a third input coupling means connecting said collector terminal of said steering transistor to said second output terminal of said binary counter circuit, first capacitor means connecting the bases of said first pnp and said first npn load transistors to said emitter terminal of said steering transistor and second capacitor means connecting the bases of said second pnp and said second npn load transistors to the collector terminal of said steering transistor, said first and second capacitor means having a low impedance over the frequency range in which said counter circuit operates.

2. The counter circuit according to claim 1 wherein said second and third input coupling means are current limiting resistors.

References Cited in the file of this patent

UNITED STATES PATENTS

| | | |
|---|---|---|
| 2,787,712 | Priebe et al. | Apr. 2, 1957 |
| 2,846,594 | Pankratz | Aug. 5, 1958 |

OTHER REFERENCES

"Transient Analysis of Transistor Amplifiers" by Chow and Suran, Electronics, November 1953, pages 189–191.